United States Patent
Lin

(10) Patent No.: US 12,253,797 B2
(45) Date of Patent: *Mar. 18, 2025

(54) PELLICLE DESIGN FOR MASK APPLICATION

(71) Applicant: Taiwan Semiconductor Manufacturing Co., Ltd., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/360,030

(22) Filed: Jul. 27, 2023

(65) Prior Publication Data

US 2023/0367205 A1 Nov. 16, 2023

Related U.S. Application Data

(60) Continuation of application No. 17/815,070, filed on Jul. 26, 2022, now Pat. No. 11,762,282, which is a division of application No. 16/775,634, filed on Jan. 29, 2020, now Pat. No. 11,454,881.

(60) Provisional application No. 62/880,810, filed on Jul. 31, 2019.

(51) Int. Cl.
G03F 1/64 (2012.01)
G03F 7/00 (2006.01)

(52) U.S. Cl.
CPC ............ *G03F 1/64* (2013.01); *G03F 7/70733* (2013.01)

(58) Field of Classification Search
CPC ........... G03F 1/62; G03F 1/64; G03F 7/70733
USPC ........................................................ 430/5
See application file for complete search history.

(56) References Cited

U.S. PATENT DOCUMENTS

| | | | |
|---|---|---|---|
| 6,350,549 B1 | 2/2002 | Sakurai et al. | |
| 6,841,312 B1 | 1/2005 | Kalk | |
| 8,796,666 B1 | 8/2014 | Huang et al. | |
| 8,841,047 B2 | 9/2014 | Yu et al. | |
| 8,877,409 B2 | 11/2014 | Hsu et al. | |
| 9,093,530 B2 | 4/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,869,934 B2 | 1/2018 | Huang et al. | |
| 9,869,939 B2 | 1/2018 | Yu et al. | |
| 11,762,282 B2 * | 9/2023 | Lin .................. | G03F 7/70733 430/5 |
| 2017/0075212 A1 | 3/2017 | Goldfarb | |
| 2020/0209736 A1 | 7/2020 | Vles | |
| 2021/0033963 A1 | 2/2021 | Lin | |

FOREIGN PATENT DOCUMENTS

| | | |
|---|---|---|
| CN | 102253610 A | 11/2011 |
| CN | 203012349 U | 6/2013 |
| CN | 107045264 A | 8/2017 |
| CN | 107209451 A | 9/2017 |
| CN | 108873601 A | 11/2018 |
| CN | 110874007 A | 3/2020 |
| JP | H05188583 A | 7/1993 |
| JP | H05232689 A | 9/1993 |
| JP | 2013222143 A | 10/2013 |
| KR | 20060015795 A | 2/2006 |
| TW | M292783 U | 6/2006 |
| TW | 201535059 A | 9/2015 |
| TW | 201627753 A | 8/2016 |
| TW | 201714898 A | 5/2017 |
| TW | 201931005 A | 8/2019 |
| WO | 2016124536 A2 | 8/2016 |

* cited by examiner

*Primary Examiner* — Christopher G Young
(74) *Attorney, Agent, or Firm* — HAYNES AND BOONE, LLP

(57) ABSTRACT

The present disclosure provides an apparatus for a semiconductor lithography process. The apparatus includes a mask defining a circuit pattern to be transferred. The apparatus further includes a pellicle including a pattern formed in a first surface, wherein the pellicle is attached to the mask at the first surface. The apparatus also includes an adhesive material layer disposed between the mask and the first surface. The pattern may include a plurality of capillaries. Each capillary of the plurality of capillaries may have a dimension in a plane of the first surface between about 1 µm and about 500 µm. Each capillary of the plurality of capillaries may have a ratio of depth to width greater than or equal to about 100. The adhesive material layer may include an adhesive having a glass transition temperature ($T_g$) greater than room temperature.

20 Claims, 12 Drawing Sheets

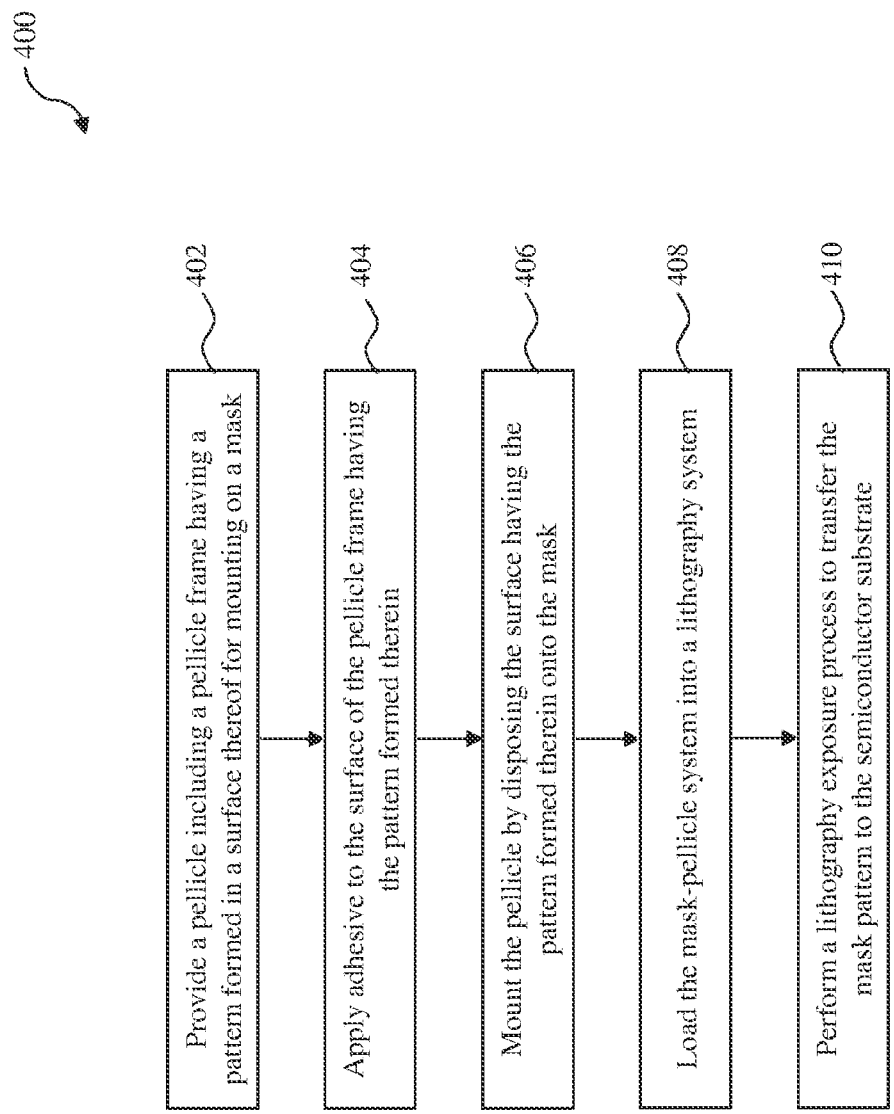

PELLICLE DESIGN FOR MASK APPLICATION

PRIORITY DATA

The present application is a continuation application of U.S. patent application Ser. No. 17/815,070, filed Jul. 26, 2022, which is a divisional application of U.S. patent application Ser. No. 16/775,634, filed Jan. 29, 2020, which claims the benefit of U.S. Provisional Application No. 62/880,810, entitled "Pellicle Design for Mask Application," filed Jul. 31, 2019, each of which is herein incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

A photolithography process forms a patterned resist layer for various patterning processes, such as etching or ion implantation. The minimum feature size that may be patterned by way of such a lithography process is limited by the wavelength of the projected radiation source. Lithography machines have gone from using ultraviolet light with a wavelength of 365 nanometers to using deep ultraviolet (DUV) light including a krypton fluoride laser (KrF laser) of 248 nanometers and an argon fluoride laser (ArF laser) of 193 nanometers, and to using extreme ultraviolet (EUV) light of a wavelength of 13.5 nanometers, improving the resolution at every step.

In the photolithography process, a photomask (or mask) is used. The mask includes a substrate and a patterned layer that defines an integrated circuit to be transferred to a semiconductor substrate during the photolithography process. The mask is typically included with a pellicle, collectively referred to as a mask system. The pellicle includes a transparent thin membrane and a pellicle frame, where the membrane is mounted over a pellicle frame. The pellicle protects the mask from fallen particles and keeps the particles out of focus so that they do not produce a patterned image, which may cause defects when the mask is being used. An internal space may be formed by the mask, the membrane, and the pellicle frame. Deficiencies in structure of the pellicle and materials used in mounting and demounting the pellicle may cause adhesive residue to remain on the mask after pellicle demounting. Adhesive residue will require manual cleaning that risks causing defects to the mask because of the residue being nearby critical pattern area and potential for scratching the mask surface. Thus, existing techniques for fabricating mask-pellicle systems have not proved entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method, in accordance with some embodiments.

DETAILED DESCRIPTION

Figure 1:
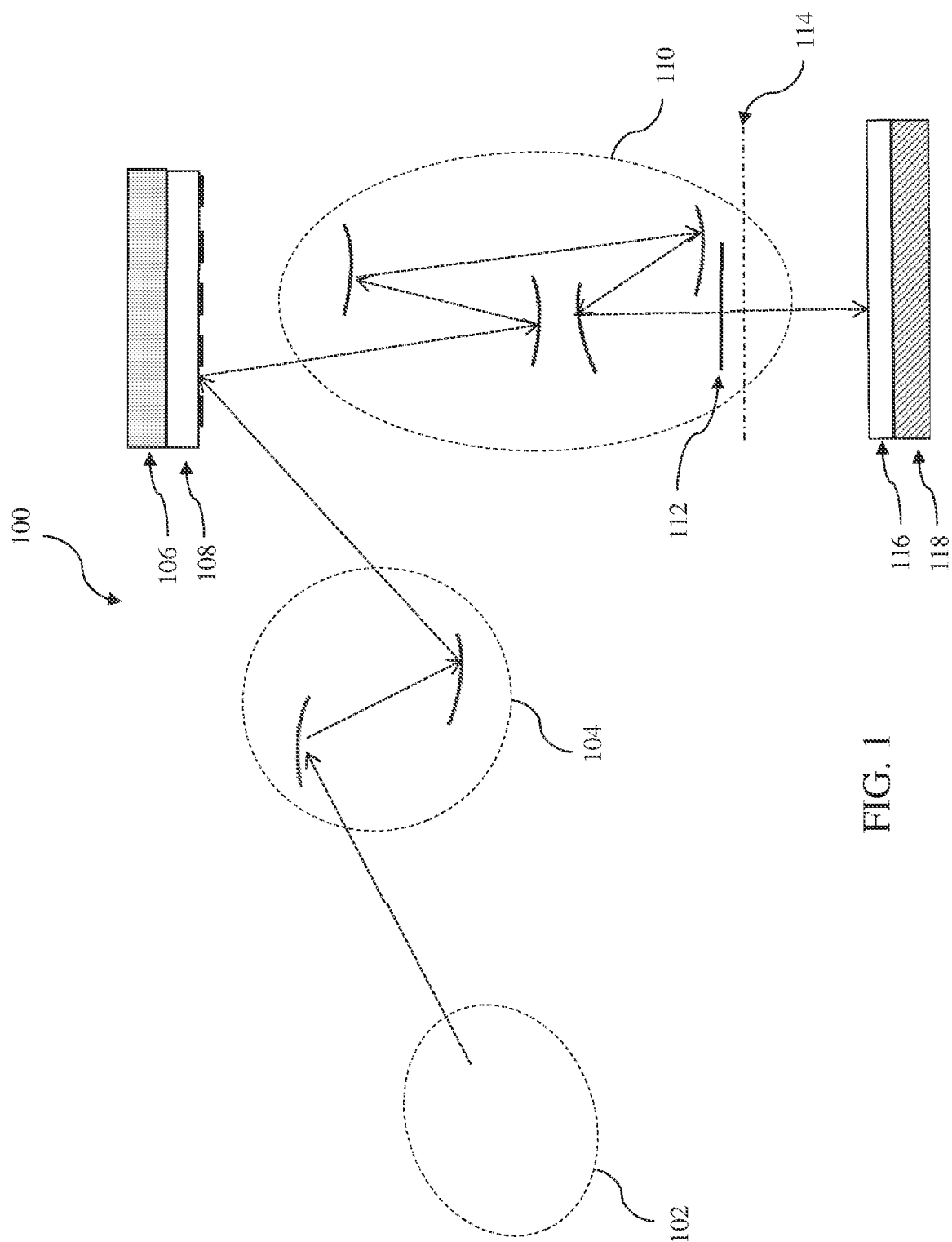
FIG. 1 is a schematic view of a lithography system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90° or at other orientations) and the spatially relative descriptors used herein may likewise be interpreted accordingly.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13.5 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm2. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

The lithography system may include other components and may have other alternatives. In some embodiments, the lithography system 100 may include a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

Figure 2:
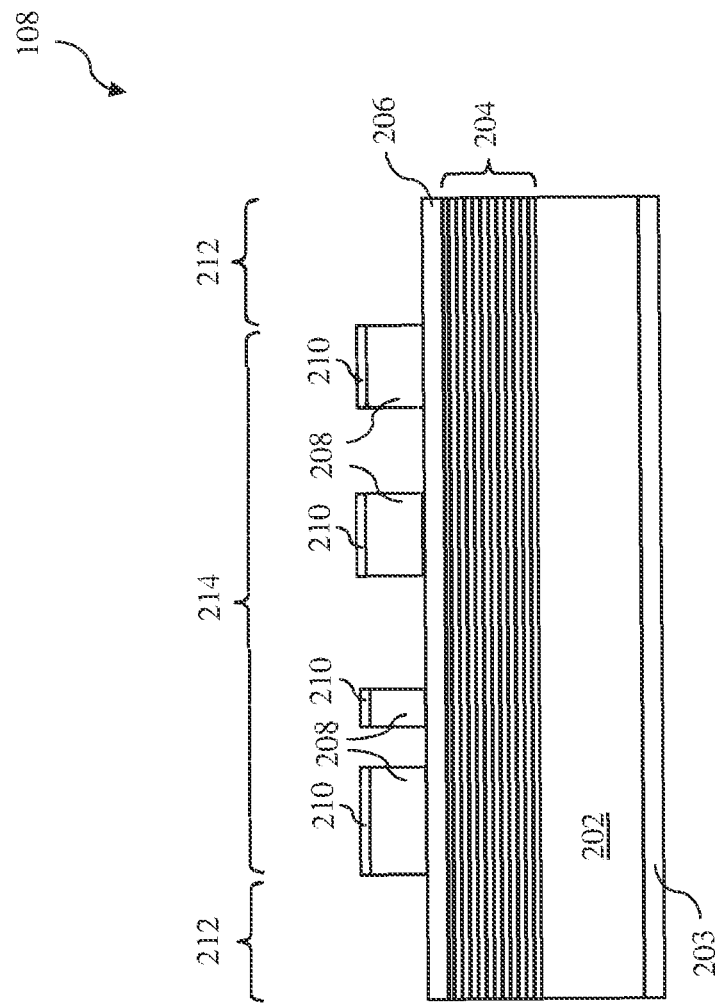
FIG. 2 is a sectional view of a mask, in accordance with some embodiments.

Returning to the mask 108, and with reference to the example of FIG. 2, illustrated therein is an example sectional view of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. The EUV mask 108 may include a boundary region 212 and a circuit region 214. The circuit region 214 may be patterned to form features that correspond to a reflected image of the mask 108 resulting from differences in EUV light reflection between reflective regions disposed between the absorbers 208 and absorptive regions encompassing the absorbers 208. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 208, such as Al, Cr, Ta, Ni, Co, and W, among others. In some examples, the ARC layer 210 includes at least one of a $Ta_xB_yO_zN_u$ layer, a $Hf_xO_y$ layer, or a $Si_xO_yN_2$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may be a PSM which utilizes interference produced by phase differences of light reflected therefrom. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask. In some illustrative embodiments of a PSM, the patterned layer 208 is reflective layer with a material stack similar to that of the multi-layer structure 204.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. Particles may be unintentionally deposited on the surface of the capping layer 206 and can result in degradation of lithographically transferred patterns if not removed. Particles may be introduced by any of a variety of methods such as during an etching process, a cleaning process, and/or during handling of the EUV mask 108. Accordingly, the mask 108 is integrated in a pellicle and is protected by the pellicle. The mask and the pellicle are collectively referred to as a mask-pellicle system. For example, during the lithography patterning process by the lithography system 100, the mask-pellicle system is secured to the mask stage 106.

Figure 3A:
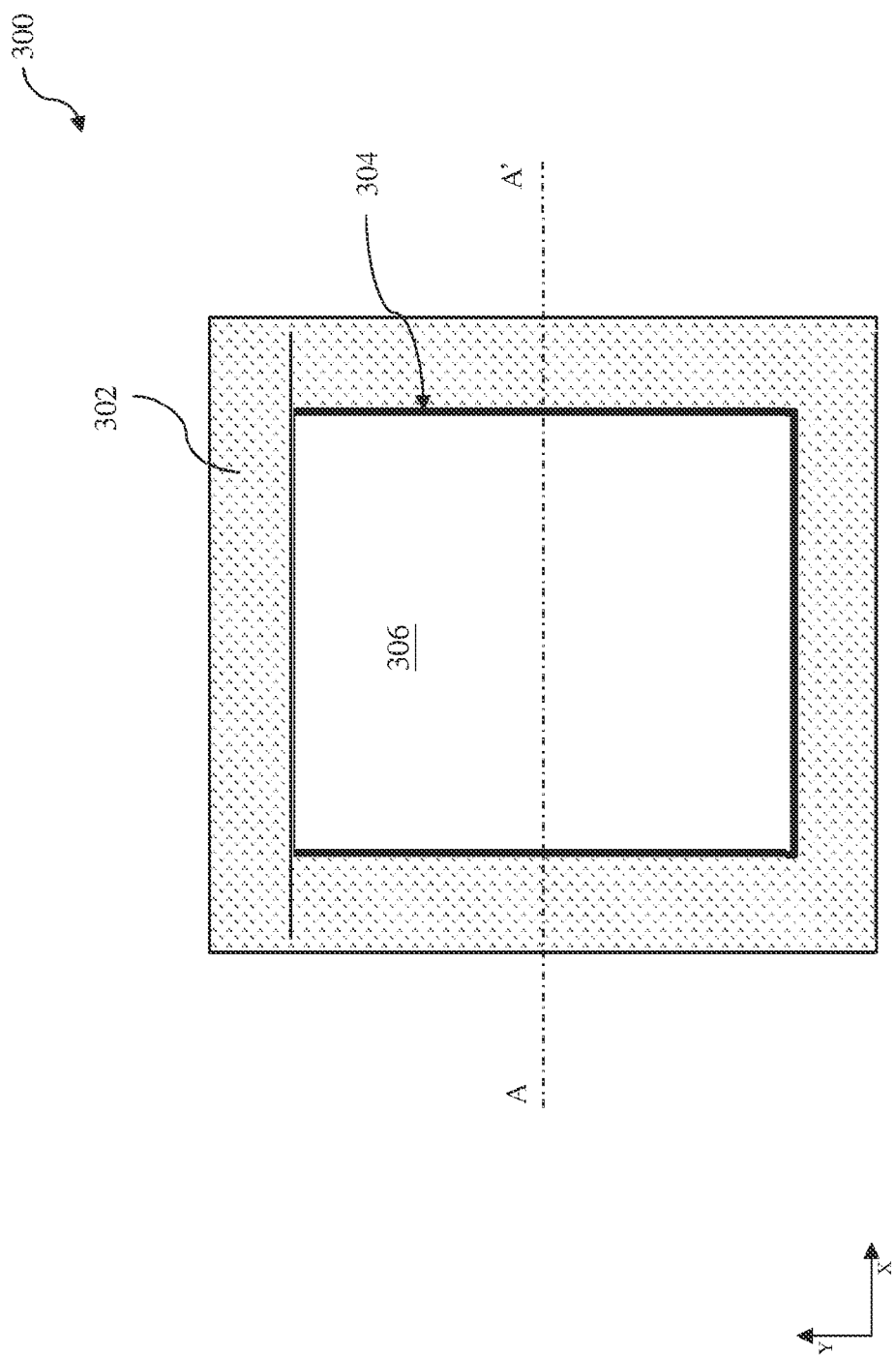
FIGS. 3A, 3B, and 3C are a top-view, a perspective view, and a sectional view along line A-A', respectively, of a mask-pellicle system, in accordance with some embodiments.
Figure 3B:
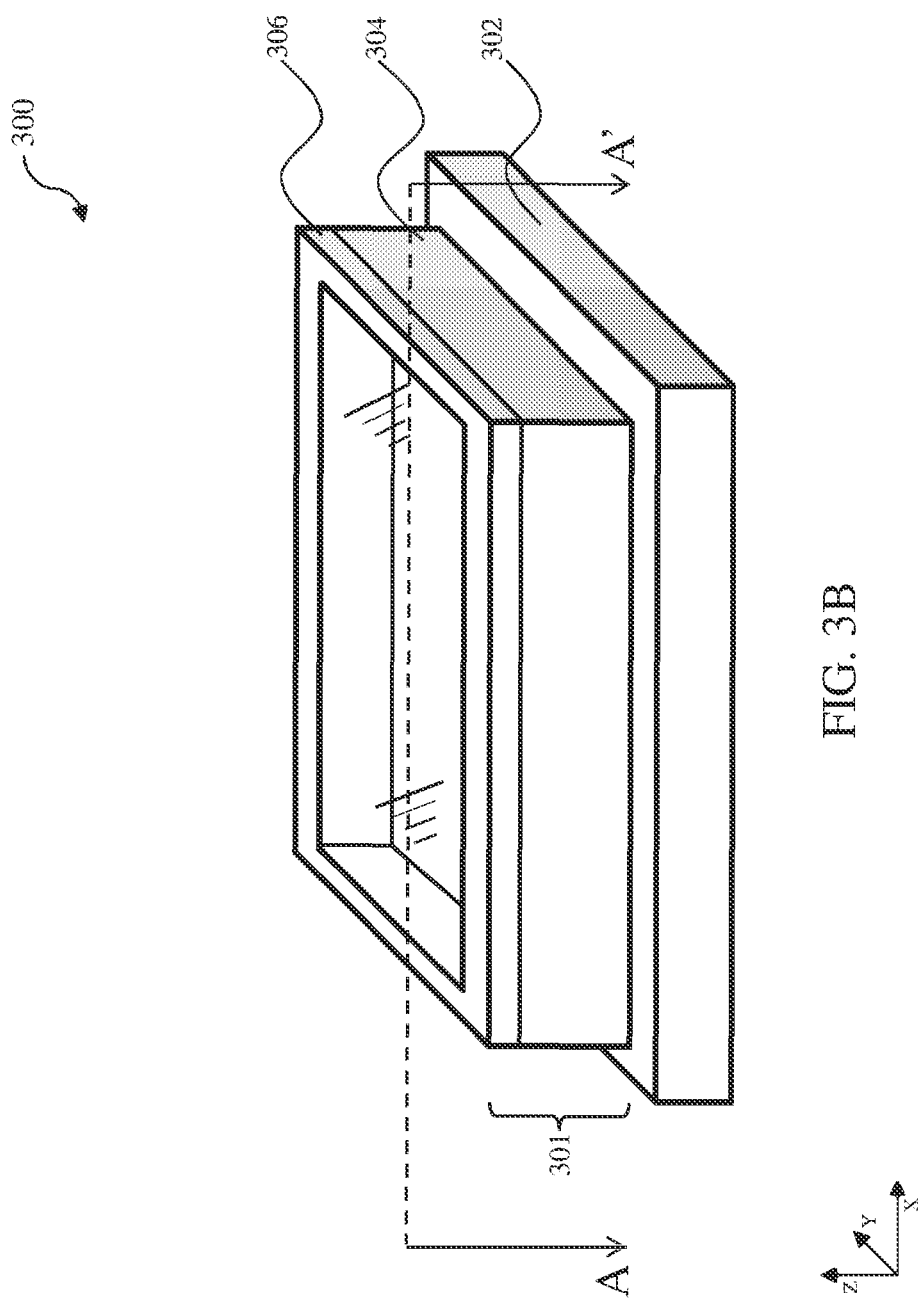
Figure 3C:
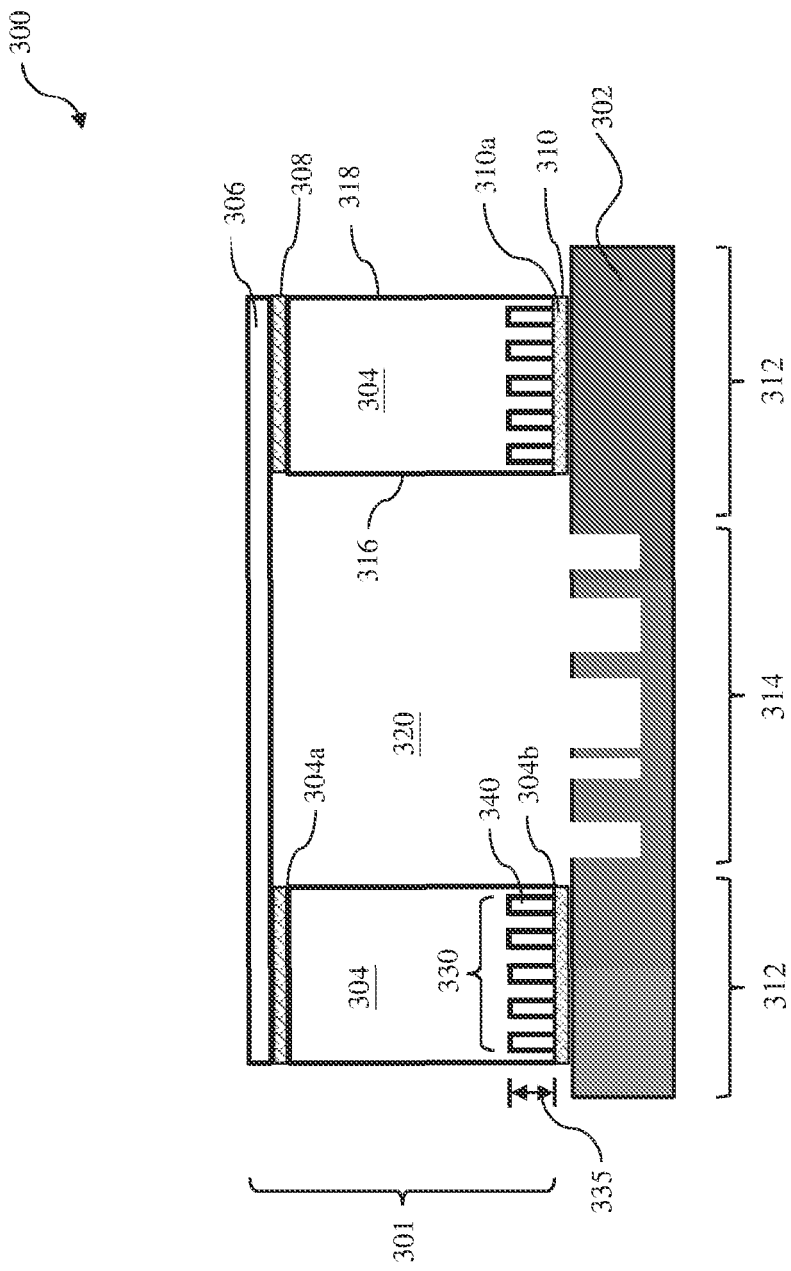

With reference to FIGS. 3A, 3B, and 3C, illustrated therein is a top-view, a perspective view, and a sectional view along line A-A', respectively, of a mask-pellicle system 300. Referring to FIGS. 3A, 3B, and 3C, the mask-pellicle system 300 and a method of using the same are described.

The mask-pellicle system 300 includes a pellicle 301 and a mask 302. The pellicle 301 may include a pellicle frame 304 and a membrane 306 (or pellicle membrane) integrated together through adhesive material layer 308. The pellicle 301 and the mask 302 may be integrated together through adhesive material layer 310. As illustrated in FIG. 3B, the mask-pellicle system 300 lies in the x-y plane with the various layers disposed relative to each other in the z-direction. As discussed above, the mask 302 also includes a boundary region 312 for attaching the pellicle 301 and a circuit region 314 used to define a circuit pattern to be transferred to a semiconductor substrate 116 by a lithographic process. In some embodiments, the mask 302 may be substantially the same as the mask 108, discussed above. In some embodiments, the circuit region 314 may include one or a plurality of patterned absorbers 208 including the ARC layer 210. In the present embodiment, the mask 302 is integrated in the mask-pellicle system 300 and is secured on the mask stage 106 collectively with the membrane 306 and the pellicle frame 304 of the pellicle 301 during a lithography patterning process.

As illustrated in FIG. 3C, the membrane 306 is configured proximate to the mask 302 and is attached to a first surface 304a of the pellicle frame 304 through the adhesive material layer 308. Particularly, the membrane 306 is attached to the pellicle frame 304 through the adhesive material layer 308. The mask 302 is further attached to a second surface 304b of the pellicle frame 304 through the adhesive material layer 310. The pellicle 301 may be attached to the boundary region 312. Thus, the mask 302, the pellicle frame 304, and the membrane 306 are configured and integrated to enclose an internal space 320. The circuit region 314 of the mask 302 is enclosed in the internal space 320 and is therefore protected from contamination during a lithography patterning process, mask shipping, and mask handling.

The membrane 306 is made of a thin film transparent to the radiation beam used in a lithography patterning process and furthermore, has a thermal conductive surface. The membrane 306 is also configured proximate to the circuit region 314 on the mask 302 as illustrated in FIG. 3C. In various embodiments, the membrane 306 includes a transparent material layer with a thermal conductive film on one surface (or both surfaces).

The mask-pellicle system 300 also includes the pellicle frame 304 configured such that the membrane 306 can be attached and secured to the pellicle frame 304. The pellicle frame 304 may be designed in various dimensions, shapes, and configurations. Among those and other alternatives, the pellicle frame 304 may have one single component or multiple components. The pellicle frame 304 includes a material with mechanical strength, being designed in dimension, shape, and configuration so as to secure the membrane 306 properly across the pellicle frame 304.

As discussed above, the pellicle frame 304 has the second surface 304b disposed over the adhesive material layer 310. The second surface 304b includes a pattern 330 formed therein. When the pellicle 301 is attached to or disposed on the mask 302, the pattern 330 is brought into contact with the adhesive material layer 310. The pattern 330 includes an array of capillaries 340. As used herein, capillary 340 generally refers to a recess, depression, or blind hole having a depth 335 in the z-direction being much, much greater than a characteristic dimension of the capillary 340 in either the x- or the y-direction. This relationship is commonly expressed as depth>>length. This relationship is derived from Jurin's law which teaches that height of a liquid column in a capillary tube is inversely proportional to a diameter of the capillary tube. While Jurin's law is strictly valid only for capillary tubes having a circular cross-section, other complementary laws instruct that the same basic relationship governs capillary tubes having a non-circular cross-section; although more complex factors are involved when considering shapes having corners such as square or triangular shapes considered herein.

Referring again to FIG. 3C, the pellicle frame 304 may include a metal, metal-alloy, or ceramic material. More specifically, the metal or metal-alloy material may include, without limitation Ti, Ti6Al4V, TiSi, Fe—Ni (INVAR), FE-NI—CO (Covar), or a combination thereof. The metal or metal-alloy material may be doped with Cu, W, Mo, Cr, or a combination thereof. In one or more embodiments, the pellicle frame 304 may be constructed of a material that may provide chosen characteristics including high mechanical strength, light weight, porosity, and/or thermal conductivity. In one or more embodiments, the pellicle frame 304 may be formed by injection molding, compression molding, lathe, milling machine, laser dicing, sintering, or a combination thereof. In one or more embodiments, the pellicle frame 304 may include an LTEM. In one or more embodiments, the pellicle frame 304 may be constructed of a material having a thermal expansion coefficient similar to that of the substrate 302 and the membrane 306. Since the mask-pellicle system 300 may be used in the lithography process at temperatures ranging from about room temperature to about 150° C., providing the substrate 302, the pellicle frame 304, and the membrane 306 having similar thermal expansion coefficients may help mitigate issues resulting from differential expansion of materials with changes in temperature. In one or more embodiments, the membrane 306 may include silicon. In one or more embodiments, the thermal expansion coefficient of the pellicle frame 304 may be similar to that of silicon.

Referring again to FIG. 3C, the adhesive material layer 310 includes an adhesive 310a (or glue), including without limitation silicon, acrylic, epoxy, thermoplastic elastomer rubber, one or more acrylic polymers or copolymers, or a combination thereof. In some examples, the adhesive 310a may include methyl methacrylate. In various embodiments, the adhesive 310a may include a gel-like material. In various embodiments, the adhesive 310a may have a crystal and/or amorphous structure. In one or more embodiments, the adhesive 310a may have a glass transition temperature ($T_g$) from about <0° C. to about 180° C. In one or more embodiments, $T_g$ may range more particularly from about 100° C. to about 180° C. It will be appreciated that when the mask-pellicle system 300 is used at temperatures up to about 100° C., as described above, it may be desirable for the $T_g$ of the adhesive 310a to be above a maximum operating temperature of the mask-pellicle system 300 to prevent the adhesive 310a from exceeding the $T_g$ during operation. In one or more embodiments, the maximum operating temperature may be a maximum temperature reached during the lithography process, not including a process of detaching the pellicle 301 from the mask 302. In some embodiments, the maximum operating temperature may range from about room temperature to about 100° C. In one or more embodiments, the adhesive 310a may have a $T_g$ above room temperature. In one or more embodiments, the adhesive 310a may have a $T_g$ at or below room temperature. In various embodiments, the adhesive 310a may undergo a thermal transition within a temperature range that spans either side of $T_g$, wherein the adhesive 310a may begin a transition from a glassy (or brittle) state to a rubbery (or viscoelastic or super-cooled liquid) state at a temperature below room temperature, and the adhesive may complete the transition to the rubbery state at a temperature above room temperature. It will be appreciated that the adhesive 310a may not flow when completely in the glassy state, whereas the adhesive 310a may begin to flow when the adhesive 310a is at least partially in the rubbery state. It will also be appreciated that the adhesive 310a may at least partially transition to the rubbery state at temperatures at or even slightly below $T_g$ depending on the technical context in which $T_g$ is defined and within which physical behaviors are characterized. It will also be appreciated that in the rubbery state, the adhesive 310a may exhibit greater mobility relative to the same adhesive 310a in the glassy state. In one or more embodiments, the adhesive 310a may include a thermal conductive component to enhance thermal conduction within the adhesive material layer 310 and between the mask 302 and the pellicle frame 304, as it will be appreciated that enhanced thermal conduction can result in more uniform heating and less temperature gradient that may improve transition of the adhesive 310a from the glassy state to the rubbery state. In various embodiments, the adhesive 310a may be designed to exhibit other desirable characteristics, such as high mechanical strength, few to no defects, little to no outgassing, EUV compatibility (no significant degradation upon EUV radiation), sustainability to high service temperature, or a combination thereof.

In various embodiments, the second surface 304b may undergo a surface treatment of oxidation or nitridation. In some embodiments, the oxidation or nitridation may be performed by a physical vapor deposition (PVD) process or furnace process. In other embodiments, a surface coating may be applied to the second surface 304b. In some embodiments, the surface coating may be applied by PVD or electroplating, which may include applying a metal or metal-alloy including W, Mo, Ni, Fe, Cr, Ti, Al, or a combination thereof. The surface treatment and/or surface coating may enhance an adhesion strength between the second surface 304b and the adhesive 310a.

In various embodiments, the pattern 330 is formed using a lithographic patterning process applied to the second surface 304b. Each of the resulting capillaries 340 has an opening formed in the second surface 304b and a depth 335 in the z-direction. In the illustrated embodiment, the individual capillaries 340 have a uniform depth 335. In other embodiments, the lithographic process may be controlled to form capillaries 340 within the same pattern 330 and/or within the same pellicle frame 304 having different depth 335. In various embodiments, the depth 335 of various capillaries 340 may range from about 10 µm to about 500 µm. More particularly, the depth 335 of various capillaries 340 may range from about 100 µm to about 500 µm. In one or more embodiments, the lithographic patterning process may include an electrochemical etching step using one or more of wet etching, dry etching, and ion etching to form the capillaries 340. Although not limited to a particular shape, in the illustrated embodiments, the individual capillaries 340 have one of square, circular, and triangular shaped openings in the x-y plane (or a plane of the second surface 304b), as illustrated in plan views of FIGS. 4A, 4B and 4C, respectively. The individual capillaries 340 are illustrated as having constant width along the depth 335. However, in one or more embodiments, the width of each capillary 340 may vary along the depth 335. More specifically, each capillary 340 may have a first width at the second surface 304b and a second width, smaller than the first width, at a farthermost end of each capillary 340 from the second surface 304b. In one or more embodiments, wet etching may be used to form a pattern 330 including capillaries 340 that vary along a depth 335 thereof.

It is noted that FIGS. 4A-4G are not drawn to scale. In fact, for clarity of discussion, dimensions of the pellicle frame 304 (corresponding to the boundary region 312 of the mask 302) are substantially increased relative to dimensions of the internal space 320 (corresponding to the circuit region 314 of the mask 302).

Figures 4A, 4B, 4C:
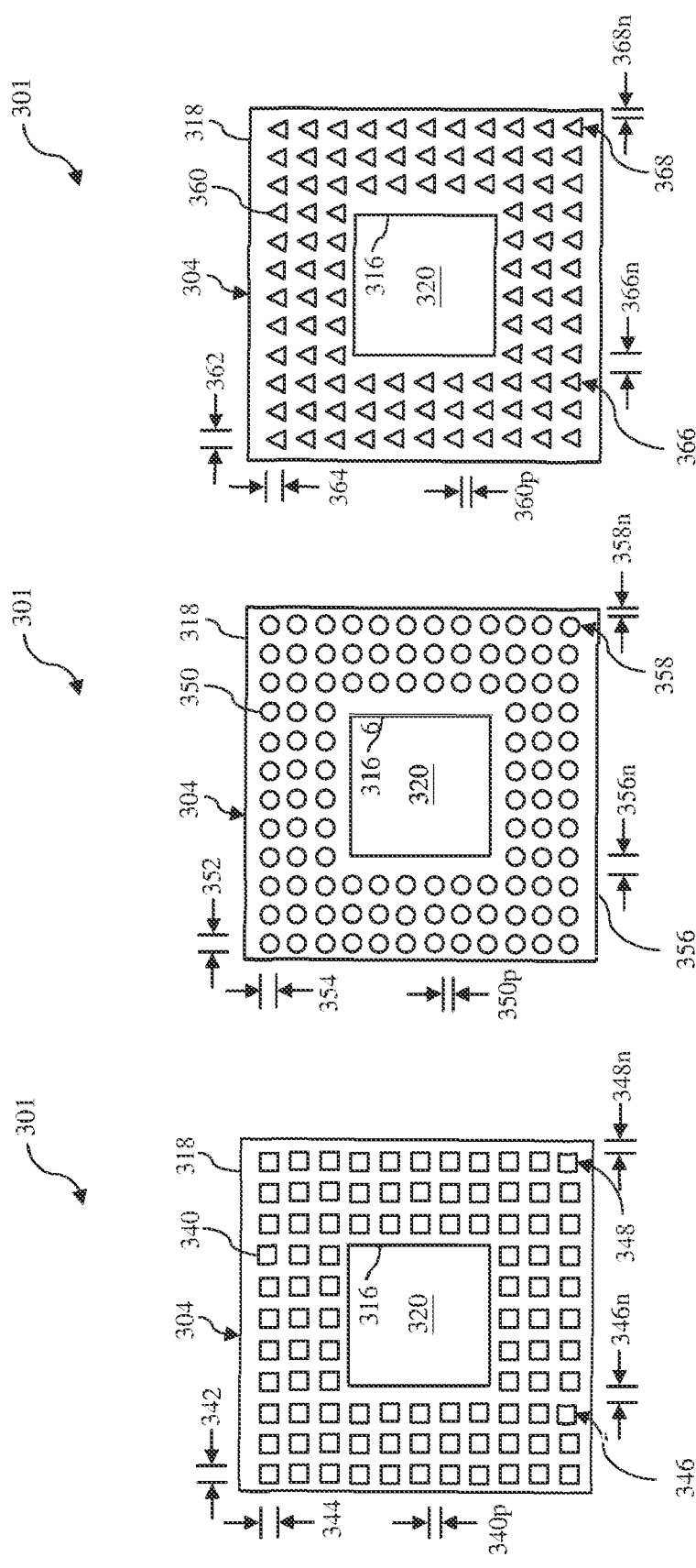
FIGS. 4A, 4B, 4C, 4D, 4E, 4F, and 4G are plan views of a pellicle, in accordance with some embodiments.

With reference to FIG. 4A, illustrated therein is a plan view of the second surface 304b of the pellicle frame 304. Referring to FIG. 4A, an embodiment of the pellicle frame 304 including the pattern 330 having square-shaped capillaries 340 is described. In the illustrated embodiment, the capillaries 340 have uniform size and spacing. Each square-shaped capillary 340 may have a width 342 in the x-direction and a length 344 in the y-direction. In some embodiments, the width 342 and length 344 may range from about 1 µm to about 500 µm. More particularly, the width 342 and the length 344 may range from about 1 µm to about 50 µm. Of course, for square-shaped capillaries 340, the width 342 and the length 344 are equal; however, in some embodiments, rectangular capillaries 340 may be formed having unequal width 342 and length 344. Each capillary 340 may be spaced from each adjacent capillary 340 by a pattern pitch 340p. In some embodiments, the pattern pitch 340p may range from about 10 µm to about 100 µm. A minimum distance 346n may be defined between an innermost row of capillaries 346 and an internal surface 316 of the pellicle frame 304. Likewise, a minimum distance 348n may be defined between an outermost row of capillaries 348 and an external surface 318 of the pellicle frame 304. In some embodiments, the minimum distance 346n, 348n may be about 0.1 mm or greater.

With reference to FIG. 4B, illustrated therein is a plan view of the second surface 304b of the pellicle frame 304. Referring to FIG. 4B, an embodiment of the pellicle frame 304 including the pattern 330 having circular capillaries 350 is described. In the illustrated embodiment, the capillaries 350 have uniform size and spacing. Each circular capillary 350 may have a major diameter 352 in the x-direction and a minor diameter 354 in the y-direction. In some embodiments, the major diameter 352 and minor diameter 354 may range from about 1 µm to about 500 µm. More particularly, the major diameter 352 and minor diameter 354 may range from about 1 µm to about 50 µm. Of course, for circular capillaries 350, the major diameter 352 and minor diameter 354 are equal; however, in some embodiments, ellipses may be formed having major diameter 352 greater than minor diameter 354. Each capillary 350 may be spaced from each adjacent capillary 350 by a pattern pitch 350p. In some embodiments, the pattern pitch 350p may range from about 10 µm to about 100 µm. A minimum distance 356n may be defined between an innermost row of capillaries 356 and an internal surface 316 of the pellicle frame 304. Likewise, a minimum distance 358n may be defined between an outermost row of capillaries 358 and an external surface 318 of the pellicle frame 304. In some embodiments, the minimum distance 356n, 358n may be about 0.1 mm or greater.

With reference to FIG. 4C, illustrated therein is a plan view of the second surface 304b of the pellicle frame 304. Referring to FIG. 4C, an embodiment of the pellicle frame 304 including the pattern 330 having triangular capillaries 360 is described. In the illustrated embodiment, the capillaries 360 have uniform size and spacing. Each triangular capillary 360 may have a width 362 in the x-direction and a height 364 in the y-direction. In some embodiments, the width 362 and height 364 may range from about 1 µm to about 500 µm. More particularly, the width 362 and height 364 may range from about 1 µm to about 50 µm. Of course, for triangular capillaries 360, width 362 and height 364 may only define equilateral and isosceles triangles, whereas other types may require specification of other sides or angles.

Although not limited to a particular type, in the illustrated embodiment, the capillaries 360 are equilateral triangles. Each capillary 360 may be spaced from each adjacent capillary 360 by a pattern pitch 360p. In some embodiments, the pattern pitch 360p may range from about 10 µm to about 100 µm. A minimum distance 366n may be defined between an innermost row of capillaries 366 and an internal surface 316 of the pellicle frame 304. Likewise, a minimum distance 368n may be defined between an outermost row of capillaries 368 and an external surface 318 of the pellicle frame 304. In some embodiments, the minimum distance 366n, 368n may be about 0.1 mm or greater.

Figure 4D:
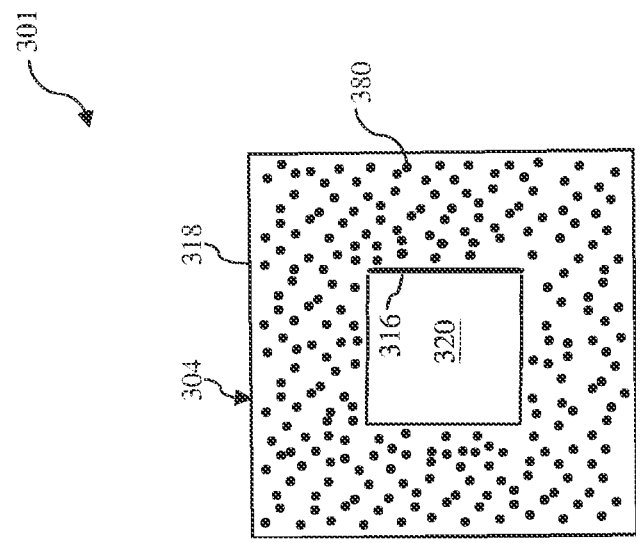

With reference to FIG. 4D, illustrated therein is a plan view of the second surface 304b of the pellicle frame 304. Referring to FIG. 4D, an embodiment of the pellicle frame 304 including the pattern 330 having capillaries 370 of variable size and spacing is described. In the illustrated embodiment, the capillaries 370 may have both nonuniform size and nonuniform spacing. Although not limited to a particular shape, in the illustrated embodiment, the capillaries 370 are square-shaped having equal x- and y-dimensions, each dimension being generically labeled as width in the present embodiment. Each capillary 370 may have a size corresponding to one of a maximum width 372, a minimum width 373, and an intermediate width 374 between the maximum width 372 and the minimum width 373. In some embodiments, the maximum width 372 and minimum width 373 may be about 1 µm to about 500 µm. More particularly, the maximum width 372 and minimum width 373 may be about 1 µm to about 50 µm. Spacing between the capillaries 370 may vary from a maximum pattern pitch 370xp to a minimum pattern pitch 370np. In some embodiments, the maximum pattern pitch 370xp and minimum pattern pitch 370np may range from about 10 µm to about 100 µm. Although not labeled, the illustrated embodiment may have minimum distances between innermost and outermost rows and internal and external surfaces 316, 318, respectively, like other embodiments. In some embodiments, the minimum distance may be about 0.1 mm or greater. In some embodiments, the capillaries 370 may have uniform size with non-uniform spacing. In other embodiments, the capillaries 370 may have nonuniform size with uniform spacing.

Figure 4E:
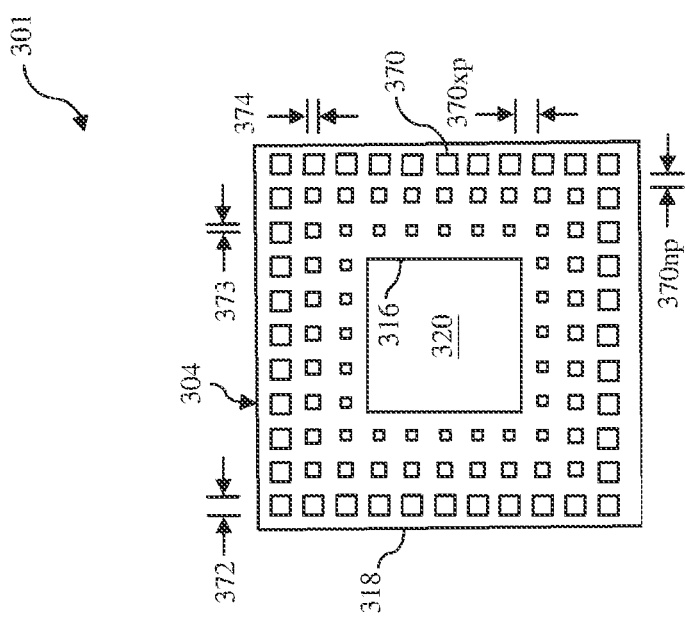

With reference to FIG. 4E, illustrated therein is a plan view of the second surface 304b of the pellicle frame 304. Referring to FIG. 4E, an embodiment of the pellicle frame 304 including the pattern 330 having nanostructured capillaries 380 is described. In the illustrated embodiment, the capillaries 380 may be formed using a laser treatment to create a random nanostructure. The laser treatment may form capillaries 380 having a nonuniform size and spacing. Furthermore, the laser treatment may form capillaries 380 that vary in depth 335 in the z-direction.

Figure 4G:
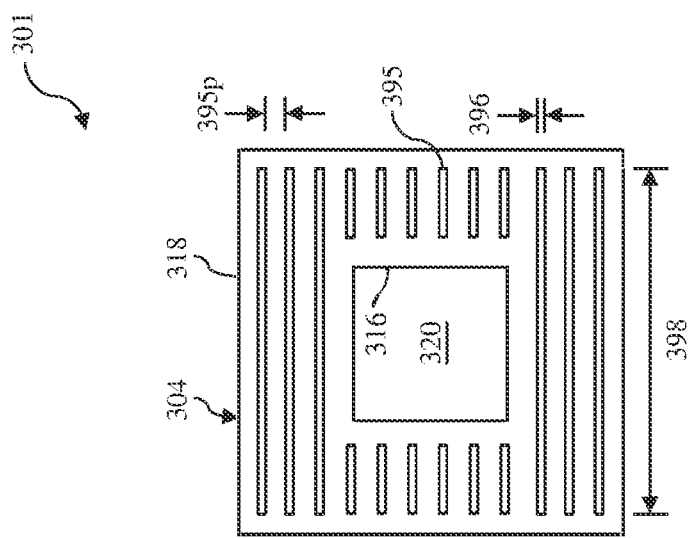
Figure 4F:
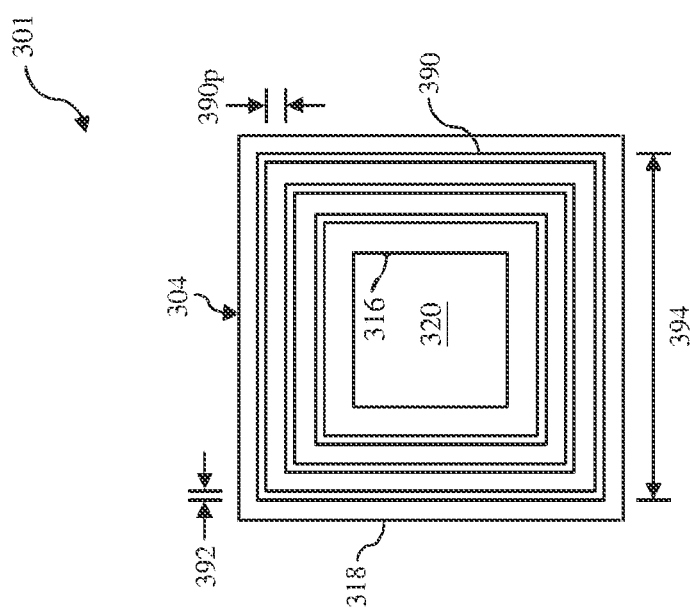

With reference to FIG. 4F, illustrated therein is a plan view of the second surface 304b of the pellicle frame 304. Referring to FIG. 4F, an embodiment of the pellicle frame 304 including the pattern 330 having elongated trenches 390 is described. In the illustrated embodiment, the trenches 390 have uniform width and uniform spacing. Each rectangular trench 390 may have a width 392 and a length 394. In some embodiments, the width 392 may be about 1 µm to about 500 µm. More particularly, the width 392 may be about 1 µm to about 50 µm. Each trench 390 may be spaced from each adjacent trench 390 by a pattern pitch 390p. In some embodiments, the pattern pitch 390p may range from about 10 µm to about 100 µm. Although not labeled, the illustrated embodiment may have minimum distances between innermost and outermost trenches and internal and external surfaces 316, 318, respectively, like other embodiments. In some embodiments, the minimum distance may be about 0.1 mm or greater. In some embodiments, the trenches 390 may have uniform width with non-uniform spacing. In other embodiments, the trenches 390 may have nonuniform width with uniform spacing.

With reference to FIG. 4G, illustrated therein is a plan view of the second surface 304b of the pellicle frame 304. Referring to FIG. 4G, an embodiment of the pellicle frame 304 including the pattern 330 having elongated trenches 395 is described. In the illustrated embodiment, the trenches 395 have uniform width and uniform spacing. Each rectangular trench 395 may have a width 396 and a length 398. In some embodiments, the width 396 may be about 1 µm to about 500 µm. More particularly, the width 396 may be about 1 µm to about 50 µm. Each trench 395 may be spaced from each adjacent trench 395 by a pattern pitch 395p. In some embodiments, the pattern pitch 395p may range from about 10 µm to about 100 µm Although not labeled, the illustrated embodiment may have minimum distances between innermost trenches or innermost ends of trenches and internal surface 316, like other embodiments. Likewise, the illustrated embodiment may have minimum distances between outermost trenches or outermost ends of trenches and external surface 318, like other embodiments. In some embodiments, the minimum distance may be about 0.1 mm or greater. In some embodiments, the trenches 395 may have uniform width with non-uniform spacing. In other embodiments, the trenches 395 may have nonuniform width with uniform spacing.

In various embodiments, the lithographic process and the laser treatment may be combined to form a pattern 330 sharing features of each technique.

Figures 5A, 5B, 5C:
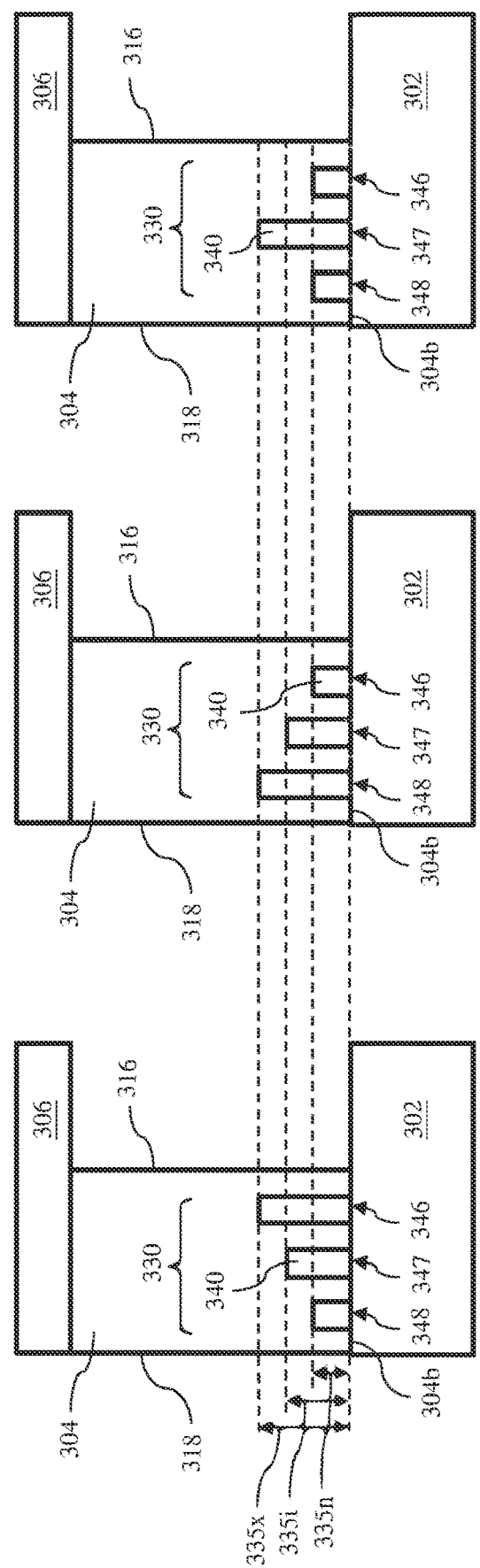
FIGS. 5A, 5B and 5C are partial sectional views of a mask-pellicle system, in accordance with some embodiments.

With reference to FIGS. 5A-5C, illustrated therein are partial sectional views of the mask-pellicle system 300. Referring to FIGS. 5A-5C, embodiments of the pellicle 301 including the pattern 330 having capillaries 340 of varying depth 335 is described. In various embodiments, each capillary 340 of the pattern 330 may have a depth corresponding to one of a maximum depth 335x for that pattern 330, a minimum depth 335n for that pattern 330, and an intermediate depth 335i for that pattern 330 between the maximum depth 335x and the minimum depth 335n. In one or more embodiments, the pattern 330 may include capillaries 340 ranging in depth from minimum depth 335n to maximum depth 335x including capillaries 340 having intermediate depth 335i. In other embodiments, the pattern 330 may have a bimodal depth distribution including capillaries 340 having either minimum depth 335n or maximum depth 335x but not intermediate depth 335i. In one or more embodiments, as illustrated in FIG. 5A, the outermost row of capillaries 348 may have minimum depth 335n, internal rows of capillaries 347 between the outermost row 348 and the innermost row 346 may have intermediate depth 335i, and the innermost row of capillaries 346 may have maximum depth 335x.

In one or more embodiments, as illustrated in FIG. 5B, the outermost row of capillaries 348 may have maximum depth 335x, internal rows of capillaries 347 may have intermediate depth 335i, and the innermost row of capillaries 346 may have minimum depth 335n.

In one or more embodiments, as illustrated in FIG. 5C, the outermost row of capillaries 348 and the innermost row of capillaries 346 may have minimum depth 335n and internal rows of capillaries 347 may have maximum depth 335x. In other embodiments, though not illustrated, the outermost row of capillaries 348 and the innermost row of capillaries 346 may have maximum depth 335x and internal rows of capillaries 347 may have minimum depth 335n. In various embodiments, various features of the patterns 330 from any of the above embodiments may be combined in various ways to produce patterns 330 having capillaries 340 of varying depth 335. In various embodiments, the maximum depth 335x, minimum depth 335n, and intermediate depth 335i may range from about 10 µm to about 500 µm. More particularly, the maximum depth 335x, minimum depth 335n, and intermediate depth 335i may range from about 100 µm to about 500 µm. In some embodiments, a ratio of depth (in the z-direction) to width (in the x- or y-direction) may be greater than or equal to about 2. More particularly, the ratio may be greater than or equal to about 100. In some embodiments, the capillaries 340 may not function at a ratio less than minimum. For example, for width above a first threshold, the capillaries 340 may exhibit inadequate capillary force to attract the adhesive 310a. In another example, for depth below a first threshold, the capillaries 340 may have insufficient volume to store adhesive 310a. In some embodiments, the ratio may range from about 2-500. More particularly, the ratio may range from about 10-500. Even more particularly, the ratio may range from about 100-500. In some embodiments, the capillaries 340 may not function at a ratio greater than maximum. For example, for width below a second threshold, adhesive forces between adhesive 310a and inner surfaces of the capillaries 340 may be insufficient to overcome cohesive forces between molecules of the adhesive 310a. In another example, for width below a third threshold, the capillaries 340 may have insufficient volume to store adhesive 310a.

Any of the above described changes to the pattern 330 including capillary shape, size, and/or spacing may be used in various combinations in order to control effectiveness of removing the adhesive 310a of the adhesive material layer 310 during demounting of the pellicle 301 from the mask 302.

Referring now to FIG. 6, illustrated is a flowchart of a method 400 for mounting the pellicle 301, constructed according to aspects of the present disclosure in some embodiments. The pellicle 301 may be mounted on the mask 302. The method 400 may be implemented at room temperature.

The method 400 includes operation 402 providing the mask 302 and the pellicle 301 including the pellicle frame 304 and the membrane 306. The mask 302 and the pellicle 301 may be separately fabricated according to methods described above. The pellicle frame 304 may include the membrane 306 attached to the first surface 304a. The pellicle frame 304 may include the pattern 330 formed in the second surface 304b.

The method 400 includes operation 404 applying adhesive 310a to the second surface 304b of the pellicle frame 304. When operation 404 is performed at room temperature, and when the adhesive 310a has a glass transition above room temperature or a thermal transition temperature range spanning room temperature, the adhesive 310a may be in a glassy or partially glassy state at operation 404. In this state, the adhesive 310a will be at least partially immobile. Thus, the adhesive 310a may adhere to the second surface 304b without substantially entering, filling, or flowing into the capillaries 340 of the pattern 330.

The method 400 includes operation 406 mounting the pellicle 301 on the mask 302 by disposing the second surface 304b onto the mask 302 or by bringing the second surface 304b into contact with the mask 302. The operation 406 may be performed at room temperature. In one or more embodiments, the mounting of the pellicle 301 may be performed at room temperature to about 200° C. In one or more embodiments, at least some of the adhesive 310a may remain on the second surface 304b instead of being disposed within the pattern 330. In one or more embodiments, a majority of the adhesive 310a may remain on the second surface 304b. In one or more embodiments, substantially all the adhesive 310a may remain on the second surface 304b. Thus, when the second surface 304b contacts the mask 302, the adhesive 310a will form the adhesive layer 310 between the second surface 304b and the mask 302. The mounting operation 406 may include applying pressure, using alignment techniques, curing, cooling, applying external field, or a combination thereof.

The method 400 includes operation 408 loading the mask-pellicle system 300 in the lithography system 100 by securing the mask-pellicle system 300 to the mask stage 106 according to methods described above. The loading operation 408 may further include other steps, such as alignment after the mask-pellicle system 300 is secured on the mask stage 106. The lithography system 100 may include the semiconductor substrate 116 loaded on the substrate stage 118 of the lithography system 100. In some examples, the semiconductor substrate 116 may be a silicon wafer coated with a photoresist layer. The photoresist layer is sensitive to the radiation beam from the radiation source 102 and is to be patterned by a lithography exposure process, such that the pattern defined on the mask 302 is transferred to the photoresist layer.

The method 400 includes operation 410 performing a lithography exposure process to transfer the pattern from the mask 302 to the semiconductor substrate 116. In one or more embodiments, the exposure process 410 may include exposing the mask-pellicle system 300 to EUV light to pattern the semiconductor substrate 116 within the lithography system 100 according to methods described above.

Additional operations can be provided before, during, and after the method 400, and some of the steps described can be replaced, eliminated, or moved around for additional embodiments of the method 400. In one example, the lithography process may include soft baking, mask aligning, exposing, post-exposure baking, developing photoresist, and hard baking.

Figure 7:
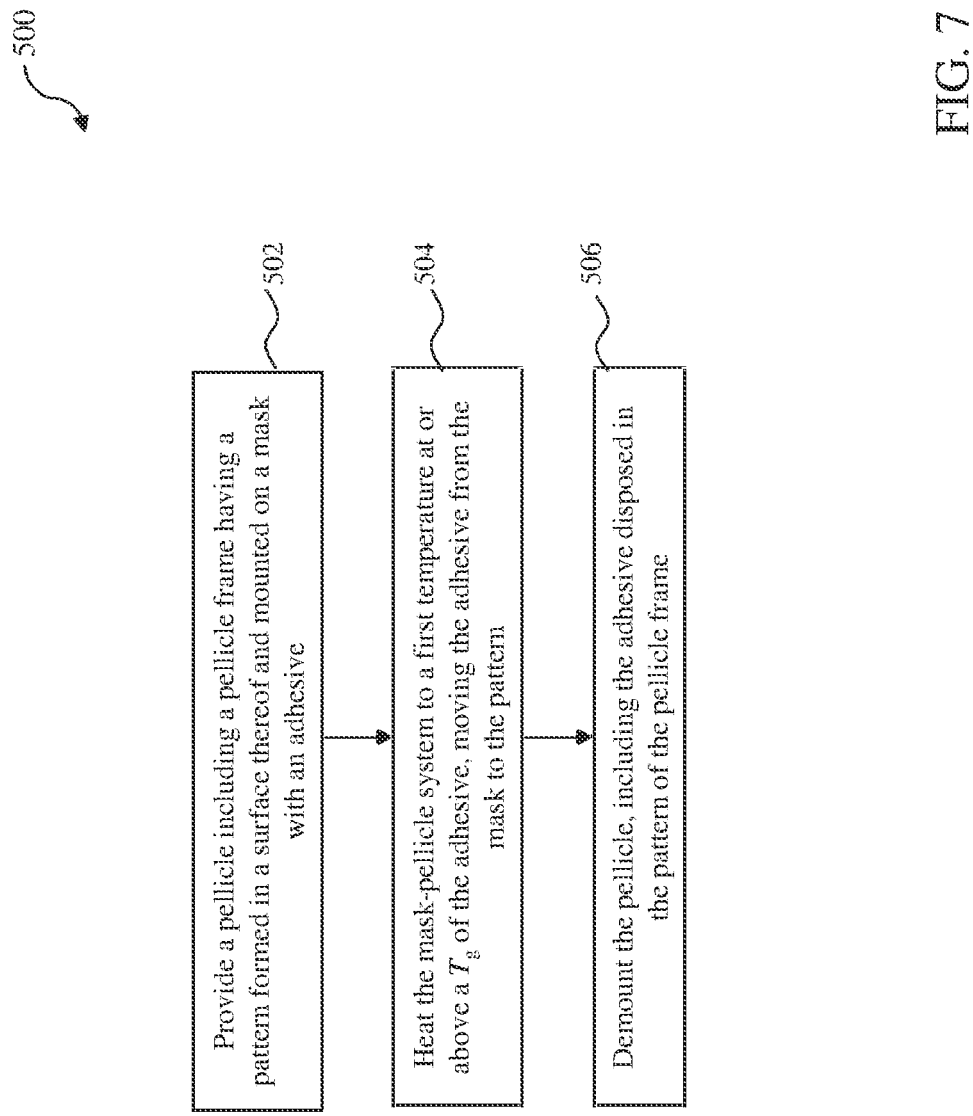
FIG. 7 is a flowchart of a method, in accordance with some embodiments.

Referring now to FIG. 7, illustrated is a flowchart of a method 500 for demounting the pellicle 301, constructed according to aspects of the present disclosure in some embodiments. The pellicle 301 may be demounted from the mask 302. The method 500 may be implemented at a temperature greater than room temperature.

The method 500 includes operation 502 providing the mask-pellicle system 300 including the mask 302 and the pellicle 301 including the frame 304 and the membrane 306. The pellicle frame 304 may include the pattern 330 formed in the second surface 304b thereof. The mask-pellicle system 300 may be provided by removing the mask-pellicle system 300 from the mask stage 106 of the lithography system 100, opposite of the securing operation 408 of method 400.

The method 500 includes operation 504 heating the mask-pellicle system 300 to a temperature at or above the $T_g$ of the adhesive 310a. Heating the adhesive 310a above $T_g$ may transition the adhesive 310a from the glassy state to the rubbery state, as described above. In the rubbery state, the adhesive 310a may exhibit improved mobility. In one or more embodiments, a heating temperature for demounting may range from about $T_g$ to about 200° C. In some embodiments, the heating temperature for demounting may range from about room temperature to about 200° C. In some embodiments, the heating temperature for demounting may range more specifically from about 100° C. to about 180° C. At any temperature slightly below, at, or above $T_g$, the adhesive 310a may begin a process of at least partially being removed from the mask 302 and at least partially entering, filling, or flowing into the capillaries 340 of the pattern 330. In some embodiments, at least a portion of the adhesive 310a may move from the mask 302 to the pattern 330 by a capillary force or capillary effect. In some embodiments, the portion may be greater than or equal to about 90%. In some embodiments, the portion may be approximately 100%. After at least some of the adhesive 310a has moved from the mask 302 to the pattern 330, the adhesive 310a will be at least partially disposed in the pattern 330, increasing a volume of the adhesive 310a disposed in the pattern 330 relative to a volume of the adhesive 310a disposed in the pattern 330 prior to heating.

In some embodiments, operation 504 may further include a second step of heating the mask-pellicle system 300 to a temperature equal to or greater than a melt temperature of the adhesive 310a. Heating the adhesive 310a to the melt temperature transitions the adhesive 310a from the rubbery state to a liquid state. In some embodiments, heating to the melt temperature may increase a volume of the adhesive 310a moving from the mask 302 to the pattern 330 by increasing the capillary force thereon. In some embodiments, the melt temperature may be greater than 180° C.

The method 500 includes operation 506 demounting the pellicle 301 by lifting the pellicle 301 away from the mask 302, opposite of the mounting operation 406 of method 400. The pellicle frame 304 may include adhesive 310a disposed in the pattern 330. In one or more embodiments, at least some of the adhesive 310a may be disposed in the pattern 330. In one or more embodiments, a majority of the adhesive 310a may be disposed in the pattern 330. In one or more embodiments, substantially all the adhesive 310a may be disposed in the pattern 330.

Figure 8:
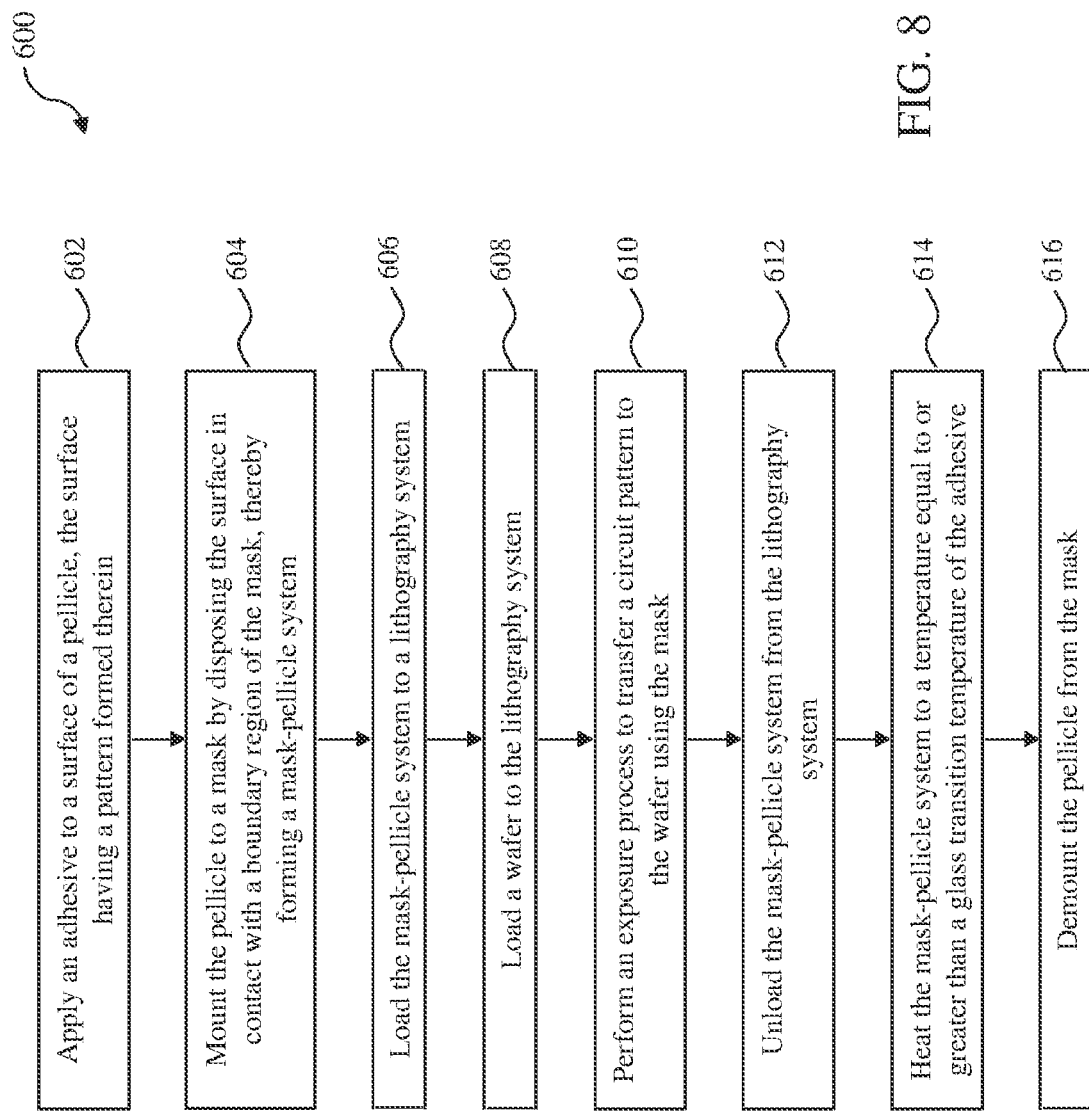
FIG. 8 is a flowchart of a method, in accordance with some embodiments.

Referring now to FIG. 8, illustrated is a flowchart of a method 600 for fabricating a semiconductor wafer, such as substrate 116, constructed according to aspects of the present disclosure in some embodiments. The method 600 may incorporate detailed description of like structures from FIGS. 1-5 without limitation. Likewise, where there is overlap, the method 600 may incorporate detailed description of like steps from the methods 400 and 500 without limitation.

The method 600 includes operation 602, applying adhesive 310a to the second surface 304b of the pellicle 301. The method 600 includes operation 604, mounting the pellicle 301 to the mask 302 by disposing the second surface 304b in contact with the boundary region 312 of the mask 302, thereby forming the mask-pellicle system 300. The method 600 includes operation 606, loading the mask-pellicle system 300 to the lithography system 100. The method 600 includes operation 608, loading the wafer to the lithography system 100. The method 600 includes operation 610, performing an exposure process to transfer a circuit pattern to the wafer using the mask 302. The method 600 includes operation 612, unloading the mask-pellicle system 300 from the lithography system 100. The method 600 includes operation 614, heating the mask-pellicle system 300 to a temperature equal to or greater than a glass transition temperature of the adhesive 310a. The method 600 includes operation 616, demounting the pellicle 301 from the mask 302.

The present disclosure provides for many different embodiments. In one embodiment, an apparatus is provided. The apparatus includes a mask defining a circuit pattern to be transferred; a pellicle including a pattern formed in a first surface, wherein the pellicle is attached to the mask at the first surface; and an adhesive material layer disposed between the mask and the first surface.

In some embodiments, a method is provided. The method includes providing the mask-pellicle system including: a mask defining a circuit pattern to be transferred; a pellicle including a pattern formed in a first surface, wherein the pellicle is attached to the mask at the first surface; and an adhesive disposed between the mask and the first surface, wherein the adhesive has a glass transition temperature ($T_g$) greater than room temperature; heating the mask-pellicle system to a first temperature equal to or greater than $T_g$; and demounting the pellicle from the mask.

In some embodiments, the method includes loading a mask-pellicle system to a lithography system, wherein the mask-pellicle system includes: a mask defining a circuit pattern to be transferred to a semiconductor wafer; a pellicle including a pattern formed in a first surface, wherein the pellicle is attached to the mask at the first surface; and an adhesive disposed between the mask and the first surface; loading the semiconductor wafer to the lithography system; and performing an exposure process to transfer the circuit pattern to the semiconductor wafer using the mask.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An apparatus for a lithography process, comprising:
   a mask defining a region for a circuit pattern; and
   a pellicle including a capillary pattern disposed in a first surface, wherein the pellicle is disposed on the mask such that the capillary pattern faces the mask, wherein the capillary pattern includes a first hole extending to a first depth within the pellicle and a second hole extending to a second depth within the pellicle, wherein the first depth and the second depth are different from each other.

2. The apparatus of claim 1, wherein the first hole is positioned closer to the region than the second hole, and wherein the first depth is greater than the second depth.

3. The apparatus of claim 1, wherein the first hole is positioned closer to the region than the second hole, and wherein the second depth is greater than the firth depth.

4. The apparatus of claim 1, wherein the capillary pattern further includes a third hole extending to a third depth within the pellicle.

5. The apparatus of claim 4, wherein the third depth is the same as the first depth.

6. The apparatus of claim 4, wherein the third depth is different than the first and second depths.

7. The apparatus of claim 1, wherein the first hole is wider than the second hole in the capillary pattern.

8. The apparatus of claim 1, further comprising an adhesive material disposed between the mask and the first surface, wherein at least a portion of the adhesive material extends within the first hole and the second hole.

9. An apparatus for a lithography process, comprising:
a mask defining a region for a circuit pattern; and
a pellicle including a plurality of trenches formed in a first surface, wherein the pellicle is disposed on the mask such that the plurality of trenches face the mask, wherein the plurality of trenches include a first trench having a first size and a second trench having a second size, wherein the first size and the second size are different from each other.

10. The apparatus of claim 9, wherein both the first trench and the second trench surround the region of the mask.

11. The apparatus of claim 9, wherein the first trench is spaced apart from the second trench and the second trench surrounds the first trench.

12. The apparatus of claim 9, wherein the first trench extends a first distance in the first surface, and
wherein the second trench extends a second distance in the first surface, the second distance being less than the first distance.

13. The apparatus of claim 9, wherein the first trench and the second trench extend the same distance the first surface.

14. The apparatus of claim 9, wherein each trench of the plurality of trenches has the same uniform width.

15. The apparatus of claim 9, wherein each trench of the plurality of trenches has a different width.

16. An apparatus for a lithography process, comprising:
a mask defining a circuit pattern;
a pellicle including a capillary pattern formed in a first surface, wherein the pellicle is disposed on the mask such that the capillary pattern faces the mask, wherein the capillary pattern includes a plurality of holes extending within the pellicle, wherein each hole of the plurality of holes has an opening with a cross-sectional shape selected from the group consisting of square, circular and triangular.

17. The apparatus of claim 16, wherein the capillary pattern is a nanostructures capillary pattern having non-uniform sizing and spacing for the plurality of holes.

18. The apparatus of claim 16, wherein a first opening of a first hole from the plurality of holes has a first size of the selected cross-sectional shape, and
wherein a second opening of a second hole from the plurality of holes has a second size of the selected cross-sectional shape, the second size being different than the first size.

19. The apparatus of claim 16, further comprising an adhesive disposed between the mask and the first surface, wherein at least a portion of the adhesive extends within the capillary pattern to a first height away from the mask.

20. The apparatus of claim 16, wherein spacing between each hole of the plurality of holes is uniformly spaced with respect to each other.

* * * * *